United States Patent
Wang et al.

(10) Patent No.: US 12,027,220 B2
(45) Date of Patent: Jul. 2, 2024

(54) ONE-TIME-PROGRAMMABLE MEMORY

(71) Applicant: Taiwan Semiconductor Manufacturing Company, Ltd., Hsinchu (TW)

(72) Inventors: Yih Wang, Hsinchu (TW); Hiroki Noguchi, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 181 days.

(21) Appl. No.: 17/536,639

(22) Filed: Nov. 29, 2021

(65) Prior Publication Data
US 2022/0084611 A1 Mar. 17, 2022

Related U.S. Application Data

(62) Division of application No. 16/803,202, filed on Feb. 27, 2020, now Pat. No. 11,189,356.

(51) Int. Cl.
*G11C 17/00* (2006.01)
*G11C 11/4074* (2006.01)
(Continued)

(52) U.S. Cl.
CPC .......... *G11C 17/12* (2013.01); *G11C 11/4074* (2013.01); *G11C 11/4085* (2013.01);
(Continued)

(58) Field of Classification Search
CPC . G11C 17/12; G11C 11/4074; G11C 11/4085; G11C 11/4094; G11C 17/16; H01L 21/823425
(Continued)

(56) References Cited

U.S. PATENT DOCUMENTS 7,656,738 B2 * 2/2010 Namekawa ............ G11C 17/16
365/207
7,710,813 B1 * 5/2010 Im ......................... G11C 17/16
365/96
(Continued)

FOREIGN PATENT DOCUMENTS

CN 104347637 A 2/2015
CN 104425448 A 3/2015
(Continued)

OTHER PUBLICATIONS

Session 11 Overview: Nonvolatile Memory Solutions, 2017 IEEE International Solid-State Circuits Conference, 14 pages (Feb. 7, 2017).

*Primary Examiner* — Viet Q Nguyen
(74) *Attorney, Agent, or Firm* — MERCHANT & GOULD P.C.

(57) ABSTRACT

Various one-time-programmable (OTP) memory cells are disclosed. An OTP memory cell includes an additional dopant region that extends at least partially under the gate of a transistor, such as an anti-fuse transistor. The additional dopant region provides an additional current path for a read current. Alternatively, an OTP memory cell includes three transistors; an anti-fuse transistor and two select transistors. The two select transistors can be configured as a cascaded select transistor or as two separate select transistors.

20 Claims, 11 Drawing Sheets

(51) Int. Cl.
*G11C 11/408* (2006.01)
*G11C 11/4094* (2006.01)
*G11C 17/12* (2006.01)
*G11C 17/16* (2006.01)
*H01L 21/8234* (2006.01)

(52) U.S. Cl.
CPC .......... *G11C 11/4094* (2013.01); *G11C 17/16* (2013.01); *H01L 21/823425* (2013.01)

(58) Field of Classification Search
USPC ...................................................... 365/225.7
See application file for complete search history.

(56) References Cited

U.S. PATENT DOCUMENTS

| | | | |
|---|---|---|---|
| 7,772,591 B1 | 8/2010 | Shih et al. | |
| 8,547,763 B2* | 10/2013 | Son | G11C 17/16 365/185.01 |
| 8,760,955 B2* | 6/2014 | Liao | G11C 17/18 365/187 |
| 9,076,791 B1 | 7/2015 | Chi et al. | |
| 9,196,377 B1 | 11/2015 | Park | |
| 9,224,496 B2 | 12/2015 | Chung | |
| 9,324,381 B2 | 4/2016 | Wu et al. | |
| 9,524,795 B2* | 12/2016 | Lee | G11C 17/16 |
| 9,589,971 B1* | 3/2017 | Chang | H01L 29/1083 |
| 9,613,714 B1* | 4/2017 | Wong | G06F 21/73 |
| 9,620,176 B2* | 4/2017 | Wu | G11C 11/24 |
| 9,634,015 B2* | 4/2017 | Wong | H01L 23/53271 |
| 9,786,383 B2* | 10/2017 | Chen | G11C 17/16 |
| 9,799,662 B2* | 10/2017 | Wong | H01L 23/5226 |
| 10,132,522 B2* | 11/2018 | Erb | F28D 9/0068 |
| 10,163,520 B1 | 12/2018 | Jian et al. | |
| 10,475,491 B2* | 11/2019 | Chen | H04L 9/0866 |
| 10,649,735 B2* | 5/2020 | Chen | G09C 1/00 |
| 10,714,201 B2* | 7/2020 | Lee | G11C 8/08 |
| 10,783,976 B2* | 9/2020 | Jo | G11C 8/08 |
| 10,915,464 B2* | 2/2021 | Chen | H10B 20/20 |
| 10,916,327 B1* | 2/2021 | He | G11C 29/50 |
| 11,164,880 B2* | 11/2021 | Lo | G11C 16/0425 |
| 11,176,969 B2* | 11/2021 | Chang | H10B 20/20 |
| 11,189,356 B2* | 11/2021 | Wang | G11C 17/16 |
| 11,257,557 B2* | 2/2022 | Yan | G11C 17/16 |
| 11,276,469 B2* | 3/2022 | Chih | G11C 17/16 |
| 11,315,937 B2* | 4/2022 | Chern | G11C 17/16 |
| 11,380,693 B2* | 7/2022 | Chang | G06F 30/392 |
| 11,462,282 B2* | 10/2022 | Su | G11C 17/18 |
| 2007/0008800 A1 | 1/2007 | Jenne | |
| 2008/0019165 A1 | 1/2008 | Lin et al. | |
| 2011/0044107 A1* | 2/2011 | Wada | G11C 17/18 365/185.23 |
| 2011/0223723 A1 | 9/2011 | Candelier et al. | |
| 2011/0235388 A1* | 9/2011 | Nakano | G11C 29/785 365/96 |
| 2013/0051113 A1 | 2/2013 | Kwon | |
| 2013/0208525 A1* | 8/2013 | Peng | G11C 17/16 365/96 |
| 2014/0098591 A1 | 4/2014 | Chen et al. | |
| 2016/0379720 A1 | 12/2016 | Luan et al. | |
| 2017/0053925 A1 | 2/2017 | Wong et al. | |
| 2017/0076757 A1 | 3/2017 | Wu et al. | |
| 2017/0148801 A1 | 5/2017 | Wong et al. | |
| 2018/0005704 A1 | 1/2018 | Takaoka | |
| 2018/0053767 A1 | 2/2018 | Cheng et al. | |
| 2018/0114582 A1 | 4/2018 | Horch et al. | |
| 2019/0378584 A1 | 12/2019 | Hsu | |
| 2020/0075610 A1 | 3/2020 | Wu et al. | |
| 2022/0310683 A1* | 9/2022 | Hou | H01L 27/14658 |

FOREIGN PATENT DOCUMENTS

| | | |
|---|---|---|
| KR | 10-2010-0082046 A | 7/2010 |
| KR | 10-2012-0020272 A | 3/2012 |

\* cited by examiner

ONE-TIME-PROGRAMMABLE MEMORY

CROSS-REFERENCE TO RELATED APPLICATIONS

This application is a divisional application of U.S. patent application Ser. No. 16/803,202, filed Feb. 27, 2020, now U.S. Pat. No. 11,189,356, the entire disclosure of which is hereby incorporated herein by reference.

BACKGROUND

Many modern day electronic devices include electronic memory. Electronic memory is a device configured to store bits of data in respective memory cells. A memory cell is a circuit configured to store a bit of data, typically using one or more transistors. One type of an electronic memory is one-time programmable (OTP) memory. An OTP memory is a read-only memory that may be programmed (e.g., written to) only once.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "under", "upper," "top," "bottom," "front," "back," and the like, may be used herein for ease of description to describe one element or feature's relationship to another element(s) or feature(s) as illustrated in the Figure(s). The spatially relative terms are intended to encompass different orientations of the device in use or operation in addition to the orientation depicted in the figures. Because components in various embodiments can be positioned in a number of different orientations, the directional terminology is used for purposes of illustration only and is in no way limiting. When used in conjunction with layers of an integrated circuit, semiconductor device, or electronic device, the directional terminology is intended to be construed broadly, and therefore should not be interpreted to preclude the presence of one or more intervening layers or other intervening features or elements. Thus, a given layer that is described herein as being formed on, over, or under, or disposed on, over, or under another layer may be separated from the latter layer by one or more additional layers.

Embodiments described herein provide various one-time-programmable (OTP) memory cells. In one embodiment, the OTP memory cell includes an additional dopant region that extends under the gate of a transistor. In one embodiment, the additional dopant region extends under the gate of a word line program of an anti-fuse transistor in the OTP memory cell. The additional dopant region can minimize the diode effect, which in turn enables the memory cell current to be tightened.

In another embodiment, the OTP memory cell includes three transistors, an anti-fuse transistor and two select transistors. The select transistors can relax the voltage stress on the select transistors in the unselected OTP memory cells during programming. Additionally or alternatively, the transistors in the OTP memory cells may have shorter gate lengths due to the increased tolerance against the voltage stresses. The two select transistors can be configured as a cascaded select transistor or as two distinct select transistors.

These and other embodiments are discussed below with reference to FIGS. 1-11. However, those skilled in the art will readily appreciate that the detailed description given herein with respect to these Figures is for explanatory purposes only and should not be construed as limiting.

Figure 1:
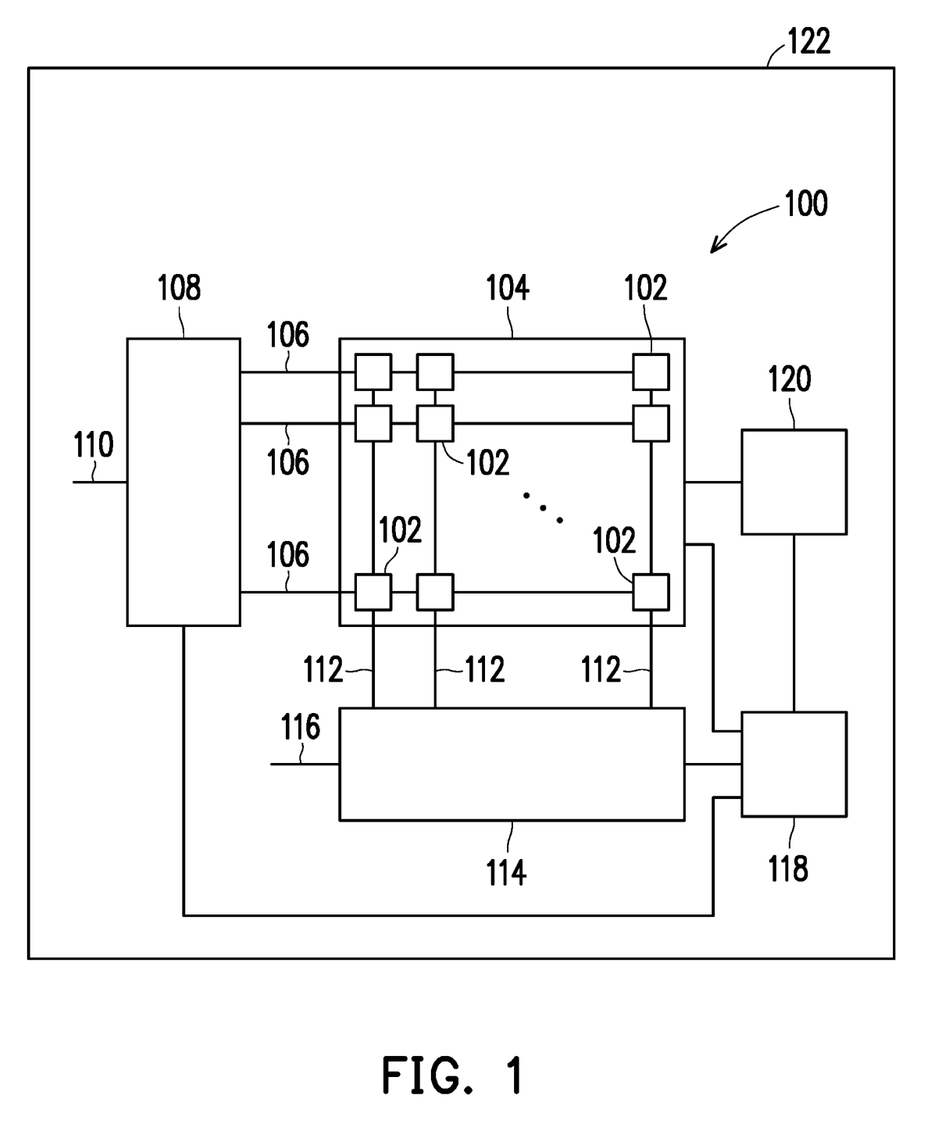
FIG. 1 illustrates a block diagram of a memory device in which aspects of the disclosure may be practiced in accordance with some embodiments.

FIG. 1 illustrates a block diagram of a memory device in which aspects of the disclosure may be practiced in accordance with some embodiments. In the illustrated embodiment, the memory device 100 includes memory cells 102 that are arranged in rows and columns to form a memory array 104. The memory device 100 can include any suitable number of rows and columns. For example, a memory device includes R number of rows and C number of columns, where R is an integer greater than or equal or one and C is a number greater than or equal to two. As will be described in more detail later, in one embodiment the memory cells 102 are OTP memory cells that include an anti-fuse transistor and one or more select transistors.

Each row of memory cells 102 is operatively connected to one or more word lines (collectively word line 106). The word lines 106 are operatively connected to one or more row select circuits (collectively referred to as row select circuit 108). The row select circuit 108 selects a particular word line 106 based on an address signal that is received on signal line 110.

Each column of memory cells 102 is operatively connected to one or more bit lines (collectively bit line 112). The bit lines 112 are operatively connected to one or more column select circuits (collectively referred to as column select circuit 114). The column select circuit 114 selects a particular bit line 112 based on a select signal that is received on signal line 116.

A processing device 118 is operatively connected to the memory array 104, the row select circuit 108, and the column select circuit 114. The processing device 118 is operable to control one or more operations of the memory array 104, the row select circuit 108, and the column select circuit 114. Any suitable processing device can be used. Example processing devices include, but are not limited to, a central processing unit, a microprocessor, an application specific integrated circuit, a graphics processing unit, a field programmable gate array, or combinations thereof.

A power supply 120 is at least operatively connected to the memory array 104 and the processing device 118. As will be described in more detail later, the processing device 118 can cause one or more bias voltages to be applied to the memory cells 102 in the memory array 104.

The processing device 118 and/or the power supply 120 can be disposed in the same circuitry (e.g., the same integrated circuit) as the memory array 104, or the processing device 118 and/or the power supply 120 may be disposed in separate circuitry from the memory array 104 and operatively connected to the memory array 104. The memory device 100, the processing device 118, and the power supply 120 are included in an electronic device 122. Example electronic devices include, but are not limited to, a computing device, a television, a camera, and a wearable device.

When data is to be written to a memory cell 102 (e.g., the memory cell 102 is programmed), or read from a memory cell 102, an address for the memory cell is received on signal line 110. The row select circuit 108 activates or asserts the word line 106 associated with the address. A select signal is received on the signal line 116 and the bit line 112 associated with the select signal is asserted or activated. The data is then written to, or read from, the memory cell 102.

Figure 2:
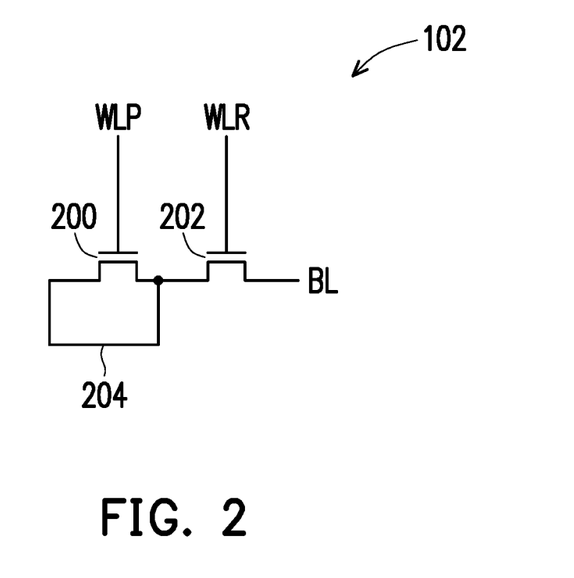
FIG. 2 depicts a schematic diagram of a first OTP memory cell in accordance with some embodiments.

FIG. 2 depicts a schematic diagram of a first OTP memory cell in accordance with some embodiments. The OTP memory cell 102 is formed with a first transistor 200 connected in series with a second transistor 202. The first transistor 200 is an anti-fuse transistor that receives a word line program (WLP) signal on the gate of the anti-fuse transistor. The second transistor 202 is a select transistor that receives a word line read (WLR) signal on the gate of the select transistor. Any suitable type of transistor can be used. In one embodiment, the first and the second transistors 200, 202 are metal oxide semiconductor (MOS) transistors.

During programming, the OTP memory cell 102 uses a permanent oxide breakdown as the one-time programming mechanism. With conventional or known OTP memory cells, a diode effect can occur in the read current path after the breakdown. As will be described in more detail later, an additional dopant region in the OTP memory cell 102 creates an additional current path 204 that reduces or minimizes the occurrence of the diode effect.

Figure 3:
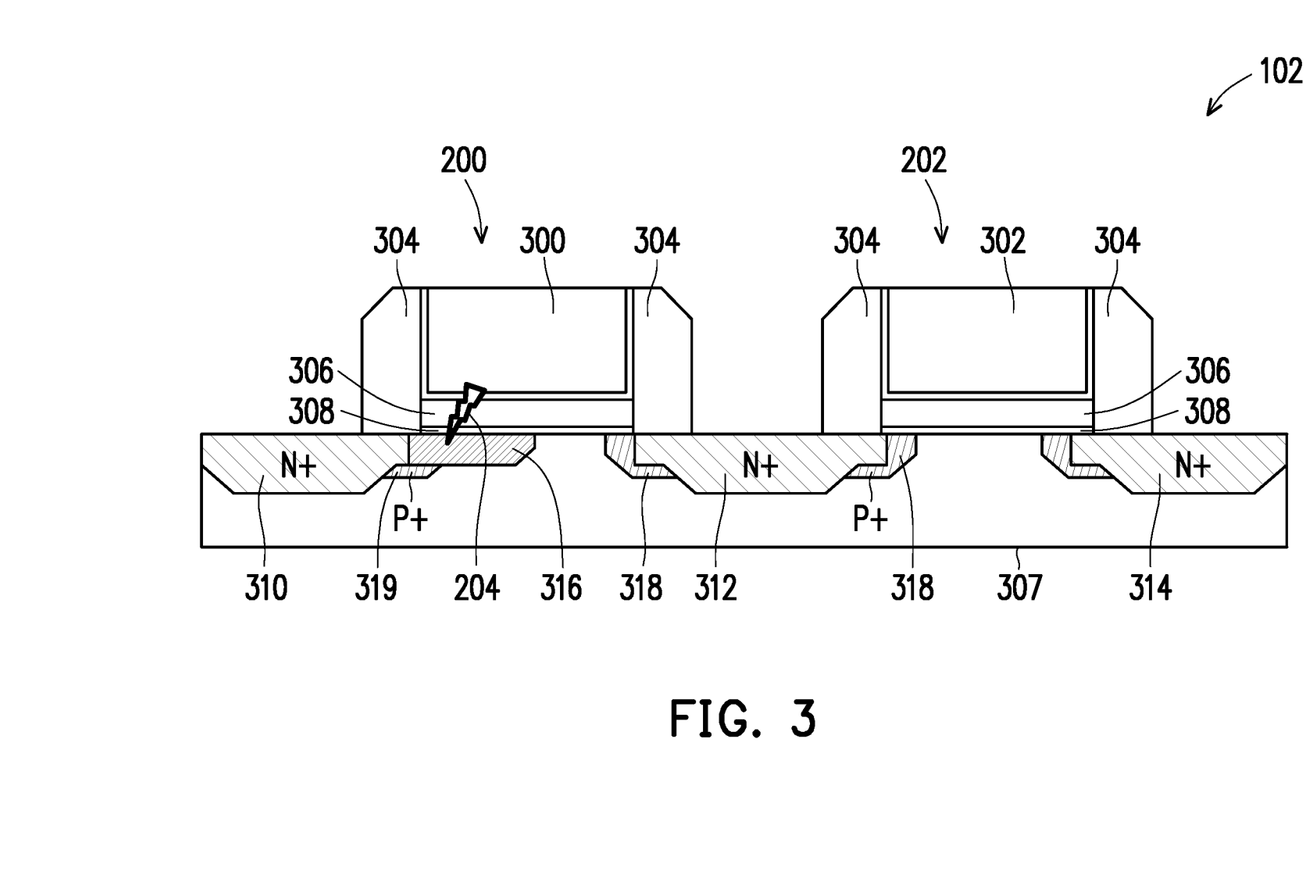
FIG. 3 illustrates an example implementation of the first OTP memory cell shown in FIG. 2.

FIG. 3 illustrates an example implementation of the first OTP memory cell shown in FIG. 2. The WLP, WLR, and BL signal lines are omitted from FIG. 3 for clarity. The first transistor 200 (e.g., the anti-fuse transistor) includes a gate 300 and the second transistor 202 (e.g., the select transistor) includes a gate 302. In one embodiment, the gates 300, 302 are metal gates. Dielectric sidewalls 304 are positioned along the sides of the gates 300, 302 to electrically isolate the gates 300, 302. Any suitable dielectric material can be used in the dielectric sidewalls 304. For example, the dielectric material can be an oxide, hafnium oxide or Zirconium oxide.

A first gate dielectric material 306 is disposed under each gate 300, 302, and a second gate dielectric material 308 is positioned under the first gate dielectric material 306 and a substrate 307. For example, the first gate dielectric material 306 is a Hi-K dielectric material (a dielectric with a high dielectric constant κ), and the second gate dielectric material 308 is a silicon dioxide material.

A first dopant region 310 and a second dopant region 312 are formed in the substrate 307 adjacent the gate 300. The second dopant region 312 and a third dopant region 314 are disposed in the substrate 307 adjacent the gate 302. The first, second, and third dopant regions 310, 312, 314 are the source and drain regions of the first and the second transistors 200, 202. An additional fourth dopant region 316 extends from the first dopant region 310 and under the gate 300 of the first transistor 200 (e.g., the anti-fuse transistor). In some embodiments, the fourth dopant region 316 resides under only a portion of the gate 300. In some embodiments, the additional fourth dopant region 316 is formed in a separate implant operation after the first, the second, and the third dopant regions 310, 312, 314 are formed. The dopant or dopants in the first, the second, and the third dopant regions 310, 312, 314 and in the fourth dopant region 316 have a first conductivity type (e.g., N conductivity type).

The fourth dopant region 316 is used to form the additional current path 204 for the read current. The fourth dopant region 316 enables the current path 204 to avoid the p-n diode that can result from the first dopant region 310 (e.g., N conductivity type) and the second halo region 319 (e.g., P conductivity type). As a result, the cell current can be increased and read margin improved.

A first halo region 318 is formed in the substrate 307 adjacent the second dopant region 312, and a second halo region 319 is formed in the substrate 307 adjacent the first dopant region 310 and the additional fourth dopant region 316. The first and the second halo regions 318, 319 are formed with a dopant or dopants having a second conductivity type (e.g., P conductivity type) that is opposite of the first conductivity type of the first dopant regions 310, 312. The first and the second halo regions 318, 319 can limit the lateral diffusion of the dopant or dopants in the first and in the second dopant regions 310, 312, respectively. In some embodiments, the first and the second halo regions 318, 319 are formed after the gates 300, 302 are defined and before the first, the second, and the third dopant regions 310, 312, 314 are formed.

In the illustrated embodiment, the first, the second, and the third dopant regions 310, 312, 314 and the additional fourth dopant region 316 are formed with an N-type dopant or dopants, and the first and the second halo regions 318, 319 are formed with a P-type dopant or dopants, although other embodiments are not limited to this implementation. An example N-type dopant is phosphorus or arsenic and an example P-type dopant is boron or gallium. The first, the second, and the third dopant regions 310, 312, 314 and the additional fourth dopant region 316 can have a higher dopant concentration (e.g., $N^+$). Similarly, the first and the second halo regions 318, 319 may have a higher dopant concentration (e.g., $P^+$) in some embodiments.

Figure 4:
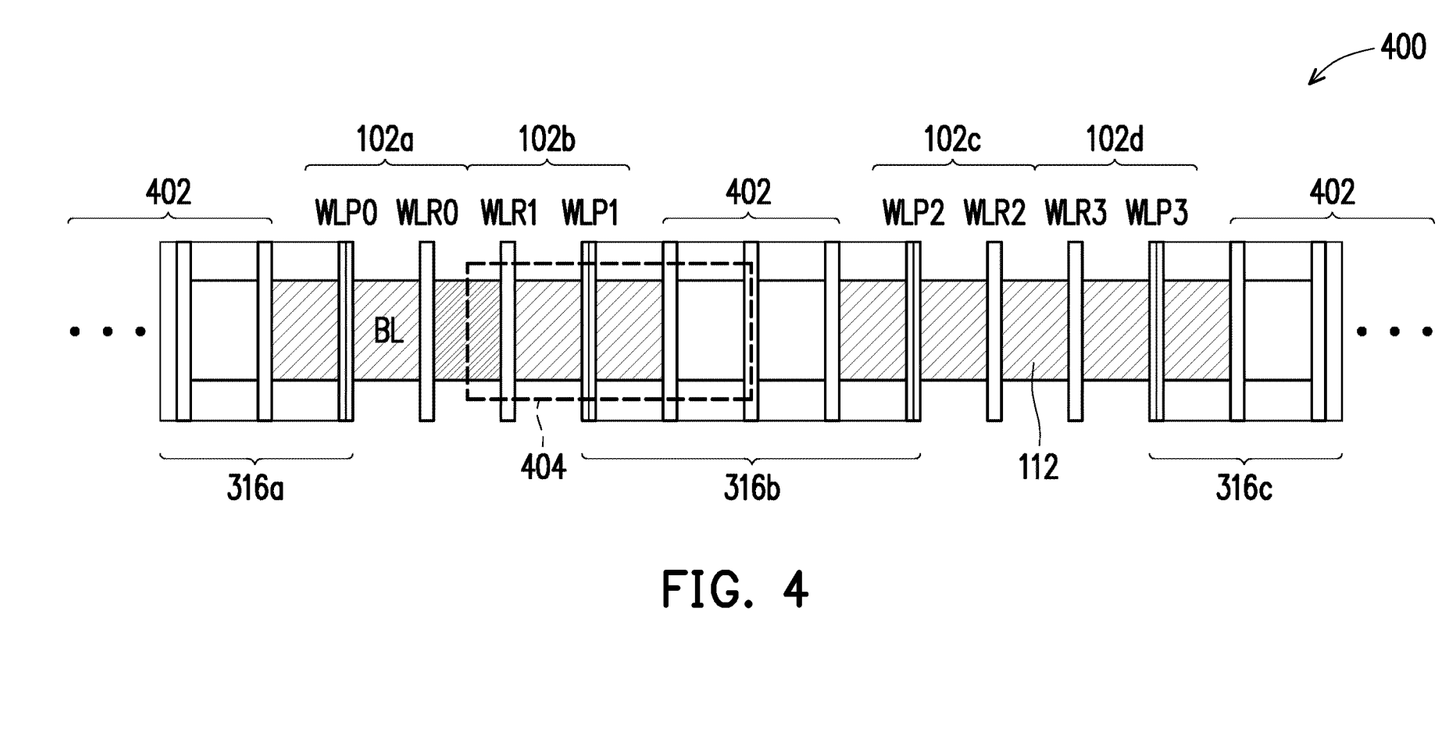
FIG. 4 depicts a layout of first OTP memory cells in accordance with some embodiments.
Figure 5:
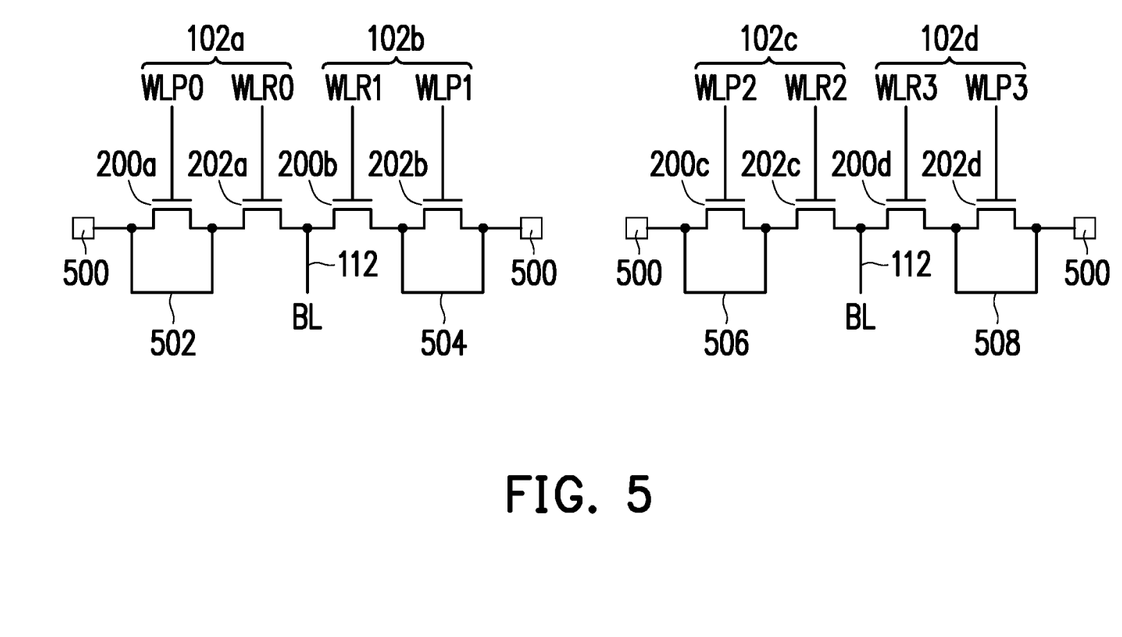
FIG. 5 illustrates a schematic diagram of the first OTP memory cells shown in FIG. 4.

FIG. 4 depicts a layout of first OTP memory cells in accordance with some embodiments. FIG. 5 illustrates a schematic diagram of the first OTP memory cells shown in FIG. 4. FIG. 4 is described in conjunction with FIG. 5. The layout 400 represents four OTP memory cells 102a, 102b, 102c, 102d. The first OTP memory cell 102a includes the first transistor 200a (FIG. 5) connected in series with the second transistor 202a (FIG. 5). As described earlier, in one embodiment the first transistor 200a is an anti-fuse transistor and the second transistor 202a is a select transistor. The gate of the first transistor 200a receives a word line program 0 (WLP0) signal and the gate of the second transistor 202a receives a word line read 0 (WLR0) signal.

The second OTP memory cell 102b includes the first transistor 200b (FIG. 5) and the second transistor 202b (FIG. 5) connected in series. The gate of the first transistor 200b receives a word line read 1 (WLR1) signal and the gate of the second transistor 202b receives a word line program 1 (WLP1) signal. The second OTP memory cell 102b is connected in series with the first OTP memory cell 102a (FIG. 5).

The third OTP memory cell 102c includes the first transistor 200c (FIG. 5) and the second transistor 202c (FIG. 5) connected in series. The gate of the first transistor 200c receives a word line program 2 (WLP2) signal and the gate of the second transistor 202c receives a word line read 2 (WLR2) signal.

The fourth OTP memory cell 102d includes the first transistor 200d (FIG. 5) and the second transistor 202d (FIG. 5) connected in series. The gate of the first transistor 200d receives a word line read 3 (WLR3) signal and the gate of the second transistor 202d receives a word line program 3 (WLP3) signal. The fourth OTP memory cell 102d is connected in series with the third OTP memory cell 102c (FIG. 5).

A bit line 112 (FIG. 5) extends along and is connected to the first, the second, and the third dopant regions (e.g., the source/drain regions 310, 312, 314 in FIG. 3) of the first and the second transistors 200a, 202a, 200b, 202b, 200c, 202c, 200d, 202d. A dummy region 402 is formed between the second OTP memory cell 102b and the third OTP memory cell 102c. A dummy region 402 is also formed adjacent the first OTP memory cell 102a and adjacent the fourth OTP memory cell 102d. The dummy regions 402 include polysilicon spacers that form the floating regions 500 (FIG. 5) that are connected to a source/drain region (e.g., the first dopant region 310 in FIG. 3) of the first memory cell 102a and to a source/drain region (e.g., the first dopant region 310 in FIG. 3) of the fourth OTP memory cell 102d. The dashed line 404 defines a one-bit OTP memory cell (e.g., OTP memory cell 102b).

The additional fourth dopant regions 316a, 316b, 316c are formed under a portion of the gates that receive the word line program signals (WLP0, WLP1, WLP2, WLP3) and overlap or extend to a source/drain region (e.g., first dopant region 310 in FIG. 3) of each first transistor 200a, 200b, 200c, 200d. As described previously in conjunction with FIG. 3, the additional fourth dopant region 316 extends to or overlaps with the first dopant region 310 (the source/drain region of the first transistor 200). The fourth dopant region 316a produces the additional current path 502 for the read current (shown in FIG. 5). The fourth dopant region 316b produces the additional current paths 504, 506. The fourth dopant region 316c produces the additional current path 508. When reading an OTP memory cell 102a, 102b, 102c, 102d, an additional current path 502, 504, 506, 508 for the read current can reduce or minimize the occurrence of the diode effect.

Figure 6:
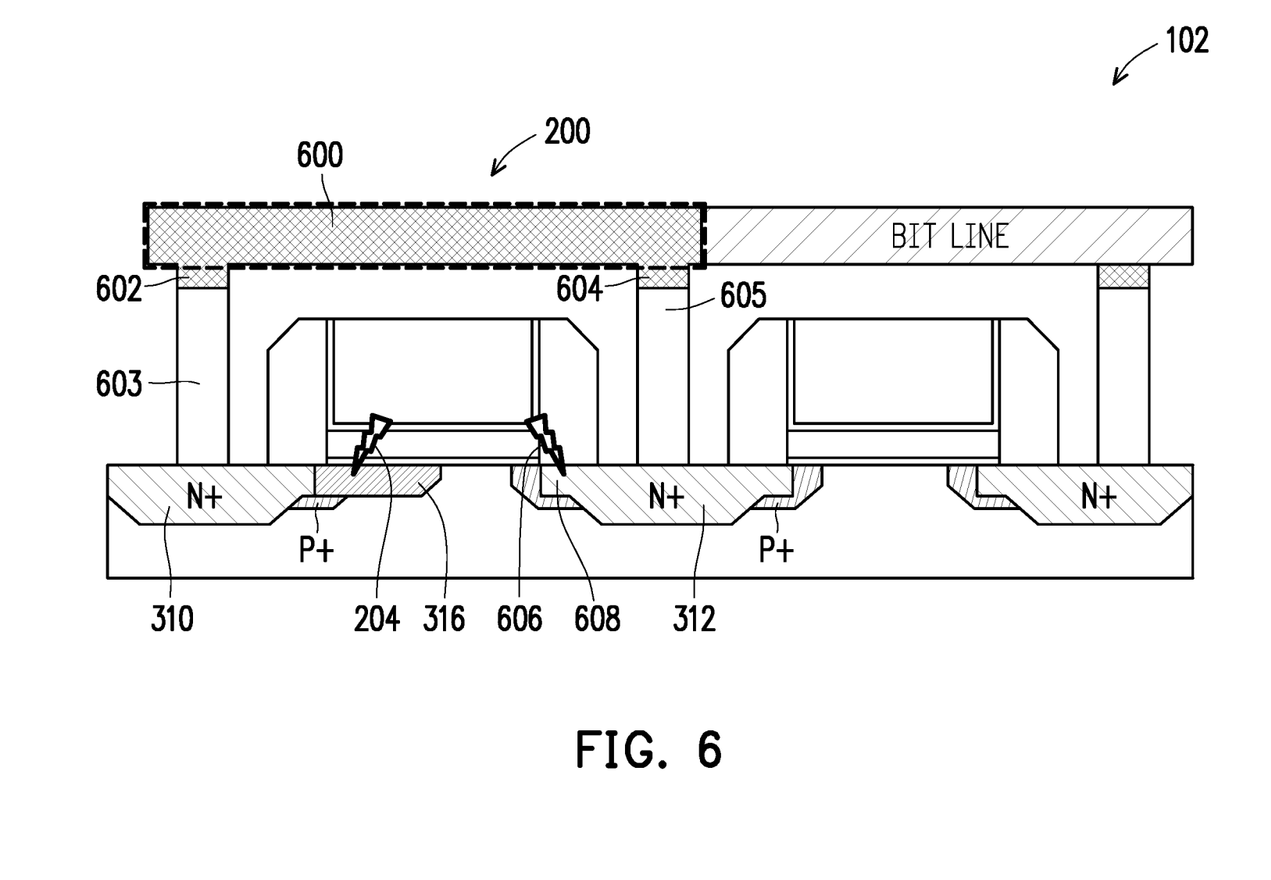
FIG. 6 depicts an example implementation of a second OTP memory cell in accordance with some embodiments.

FIG. 6 depicts an example implementation of a second OTP memory cell in accordance with some embodiments. The OTP memory cell 102 is similar to the OTP memory cell 102 shown in FIG. 3 but with the addition of the additional conductive element 600 and the first and second contacts 602, 604 between the conductive element 600 and the first and the second dopant regions 310, 312, respectively, of the first transistor 200 (e.g., the source and drain regions of the first transistor 200).

The first contact 602, through the contact via 603, is used to activate the additional current path 204 created by the additional fourth dopant region 316. The additional current path 204 is activated when a first bias voltage is applied to the first contact 602. The second contact 604, through the contact via 605, is used to activate a second current path 606 in the first transistor 200 when the first bias voltage is applied to the second contact 604. Breakdown to the tip region 608 of the second dopant region 312 forms a lower resistive link between the gate of the first transistor 200 and the second dopant region 312. The lower resistive link produces the second current path 606 (e.g., a high-current anti-fuse element).

In one embodiment, only the first contact 602 is included in each OTP memory cell and is used to activate the additional current path 204. In another embodiment, both the first contact 602 and the second contact 604 are included in each memory cell and are used to activate the additional current path 204 and the second current path 606. In other embodiments, only the second contact 604 is included in each OTP memory cell and is used to activate the second current path 606.

The second current path 606 will be on the side of the first transistor 200 associated with the second contact 604. In the illustrated embodiment, the additional current path 204 created by the additional fourth dopant region 316 is on the left side of the first transistor 200 and the second current path 606 is on the right side of the first transistor 200. Thus, the current path for the first transistor 200 is doubled (right and left sides). Additionally, the cell current can be increased based on the additional fourth dopant region 316, which in turn improves the read margin for the OTP memory cell 102.

Figure 7:
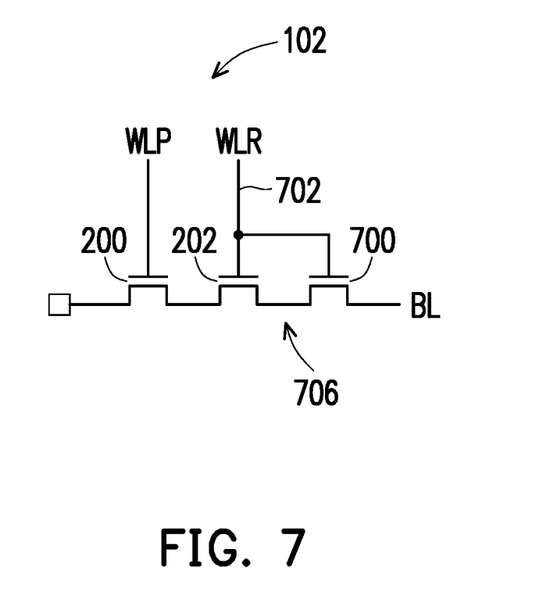
FIG. 7 illustrates a schematic diagram of a third OTP memory cell in accordance with some embodiments.

In some embodiments, the select transistors (e.g., 202) in the unselected OTP memory cells 102 can experience voltage stress when the bias voltages are applied to the gates (e.g., 300, 302 in FIG. 3) and/or the bit lines 112 when a memory cell 102 is programmed (e.g., written to). Including a third transistor in the OTP memory cells 102 can relax the voltage stresses. FIG. 7 illustrates a schematic diagram of a third OTP memory cell in accordance with some embodiments. The OTP memory cell 102 includes the first transistor 200, the second transistor 202, and a third transistor 700. In the illustrated embodiment, the second transistor 202 and the third transistor 700 are connected in parallel with the word line read (WLR) signal line 702 (connected to the gates of the second and third transistors 202, 700, respectively). Essentially, the second and the third transistors 202, 700 form a cascaded transistor 706. In one embodiment, the cascaded transistor 706 is a cascaded select transistor and the first transistor 200 is an anti-fuse transistor. The cascaded transistor 706 is connected in series with the first transistor 200. In other embodiments, the signal lines connected to the gates of the second transistor 202 and the third transistor 700 are distinct signal lines (e.g., not connected together).

The cascaded transistor 706 can relax the voltage stress, which in turn reduces the effects of the voltage stress. For example, the voltage drop across a single second transistor 202 (e.g., a select transistor) can be five volts. With a cascaded transistor 706, the voltage drop across the second transistor 202 in the cascaded transistor 706 may be 2.5 volts and the voltage drop across the third transistor 700 in the cascaded transistor 706 can be 2.5 volts.

Figure 8:
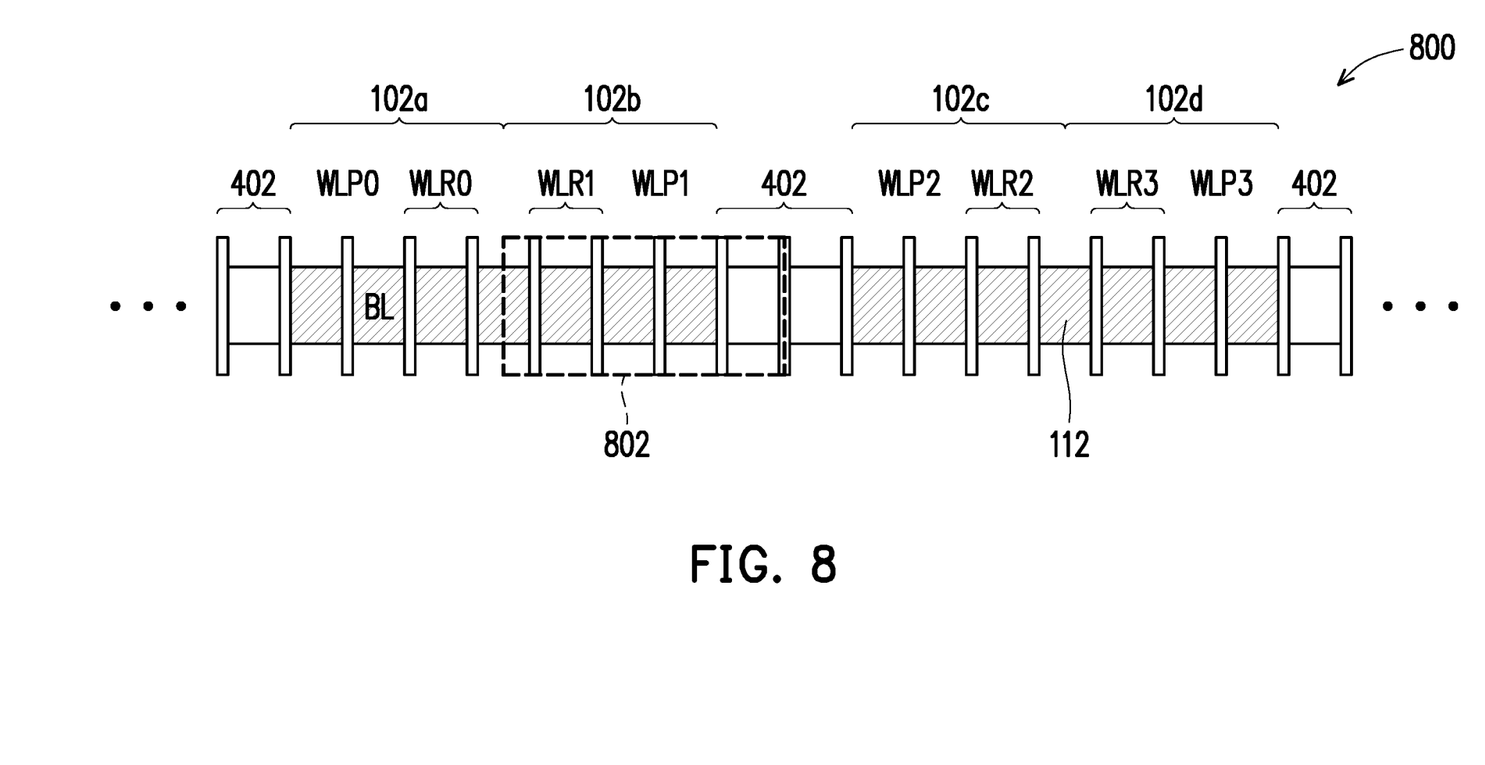
FIG. 8 depicts a layout of third OTP memory cells in accordance with some embodiments.
Figure 9:
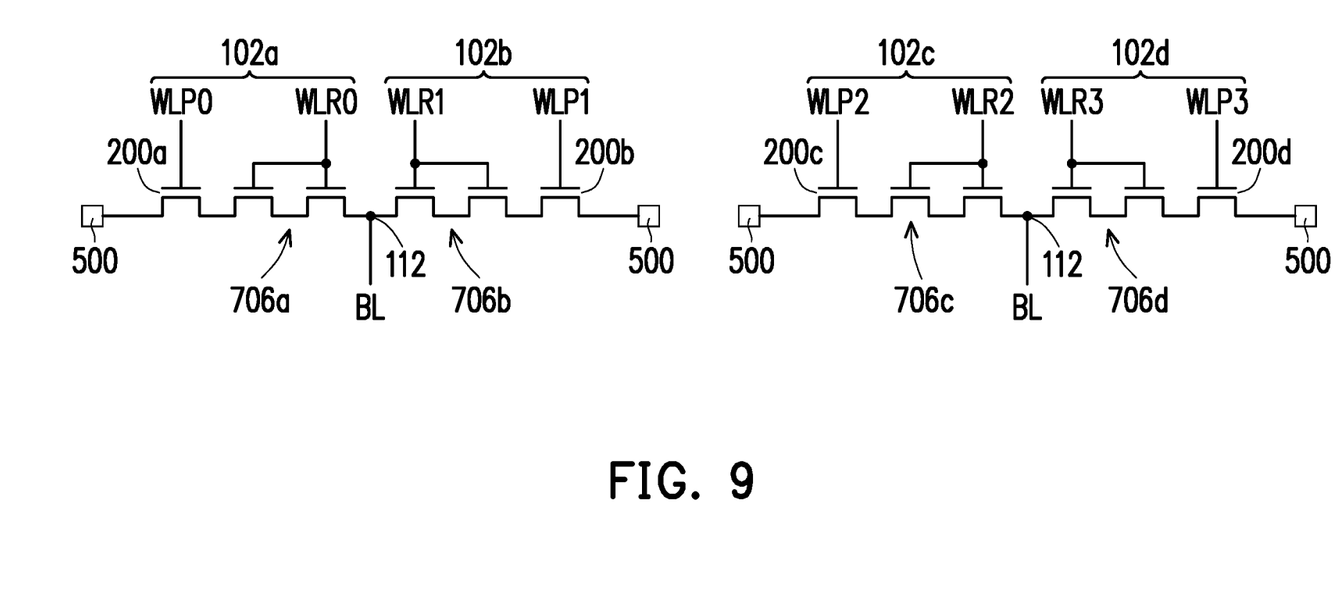
FIG. 9 illustrates a schematic diagram of the third OTP memory cells shown in FIG. 8.

FIG. 8 depicts a layout of third OTP memory cells in accordance with some embodiments. FIG. 9 illustrates a schematic diagram of the third OTP memory cells shown in FIG. 8. FIG. 8 is described in conjunction with FIG. 9. The layout 800 represents four OTP memory cells 102*a*, 102*b*, 102*c*, 102*d*. The first OTP memory cell 102*a* includes the first transistor 200*a* connected in series with the cascaded transistor 706*a*. As described earlier, in one embodiment, the first transistor is an anti-fuse transistor and the cascaded transistor is a cascaded select transistor. The gate of the first transistor 200*a* receives a word line program 0 (WLP0) signal and the gate of the cascaded transistor 706*a* receives a word line read 0 (WLR0) signal.

The second OTP memory cell 102*b* includes the first transistor 200*b* and the cascaded transistor 706*b* connected in series. The gate of the first transistor 200*b* receives a word line program 1 (WLP1) signal and the gate of the cascaded transistor 706*b* receives a word line read 1 (WLR1) signal. The second OTP memory cell 102*b* is connected in series with the first OTP memory cell 102*a*.

The third OTP memory cell 102*c* includes the first transistor 200*c* and the cascaded transistor 706*c* connected in series. The gate of the first transistor 200*c* receives a word line program 2 (WLP2) signal and the gate of the cascaded transistor 706*c* receives a word line read 2 (WLR2) signal.

The fourth OTP memory cell 102*d* includes the first transistor 200*d* and the cascaded transistor 706*d* connected in series. The gate of the first transistor 200*d* receives a word line program 3 (WLP3) signal and the gate of the cascaded transistor 706*d* receives a word line read 3 (WLR3) signal. The fourth OTP memory cell 102*d* is connected in series with the third OTP memory cell 102*c*.

A bit line 112 extends along and is connected to the source/drain regions of the first and the second transistors 200*a*, 202*a*, 200*b*, 202*b*, 200*c*, 202*c*, 200*d*, 202*d*, as shown in FIG. 9. A dummy region 402 is formed between the second OTP memory cell 102*b* and the third OTP memory cell 102*c*. A dummy region 402 is also formed adjacent the first OTP memory cell 102*a* and adjacent the fourth OTP memory cell 102*d*. As described earlier, the dummy regions 402 form the floating regions 500 that are connected to the source/drain regions (e.g., first dopant region 310 in FIG. 3) of the first and the fourth OTP memory cells 102*a*, 102*d* (see FIG. 9). The dashed line 802 defines a one-bit OTP memory cell (e.g., OTP memory cell 102*b*).

Figure 10:
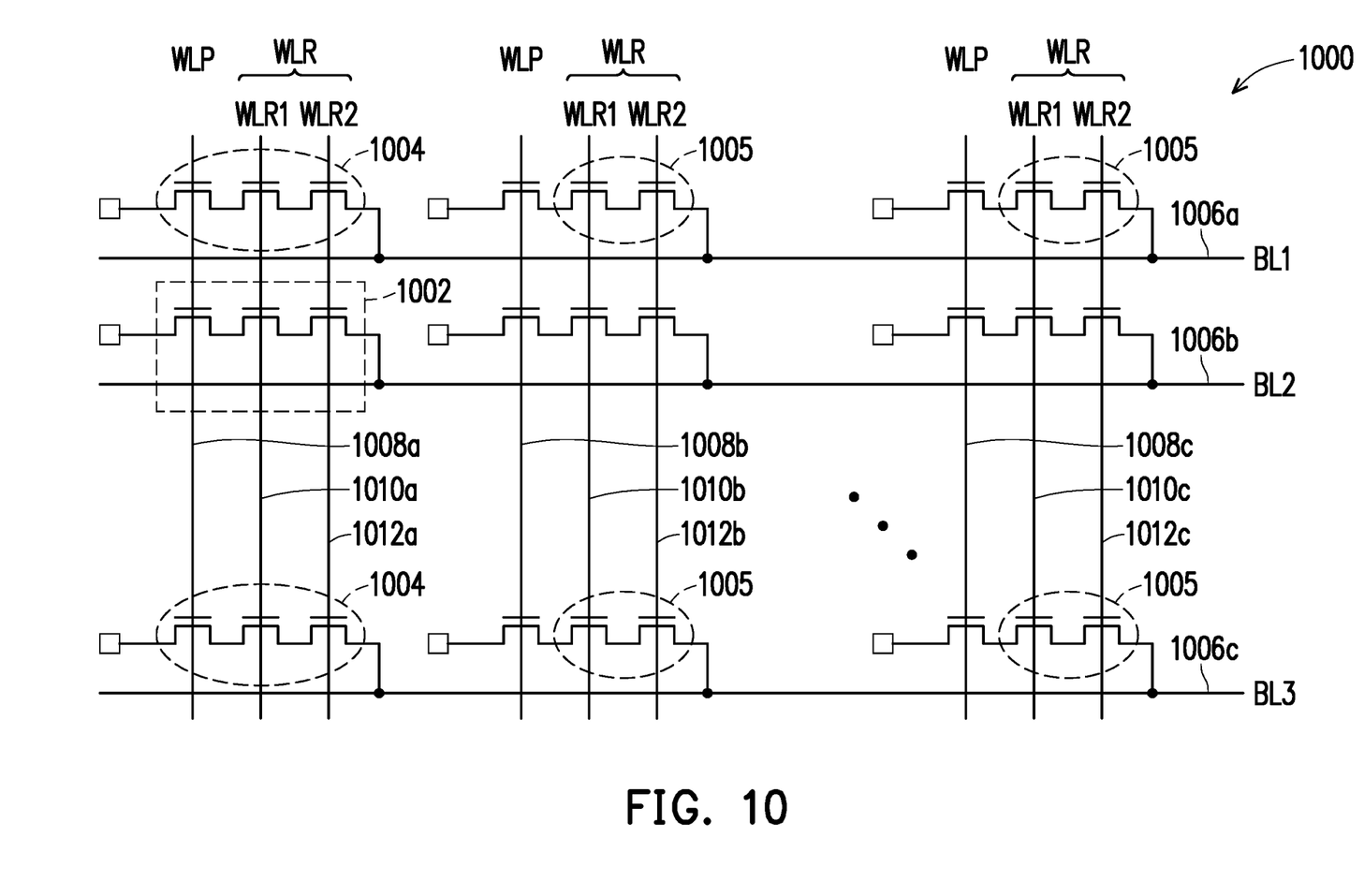
FIG. 10 depicts a memory array with third OTP memory cells in accordance with some embodiments.
Figure 11:
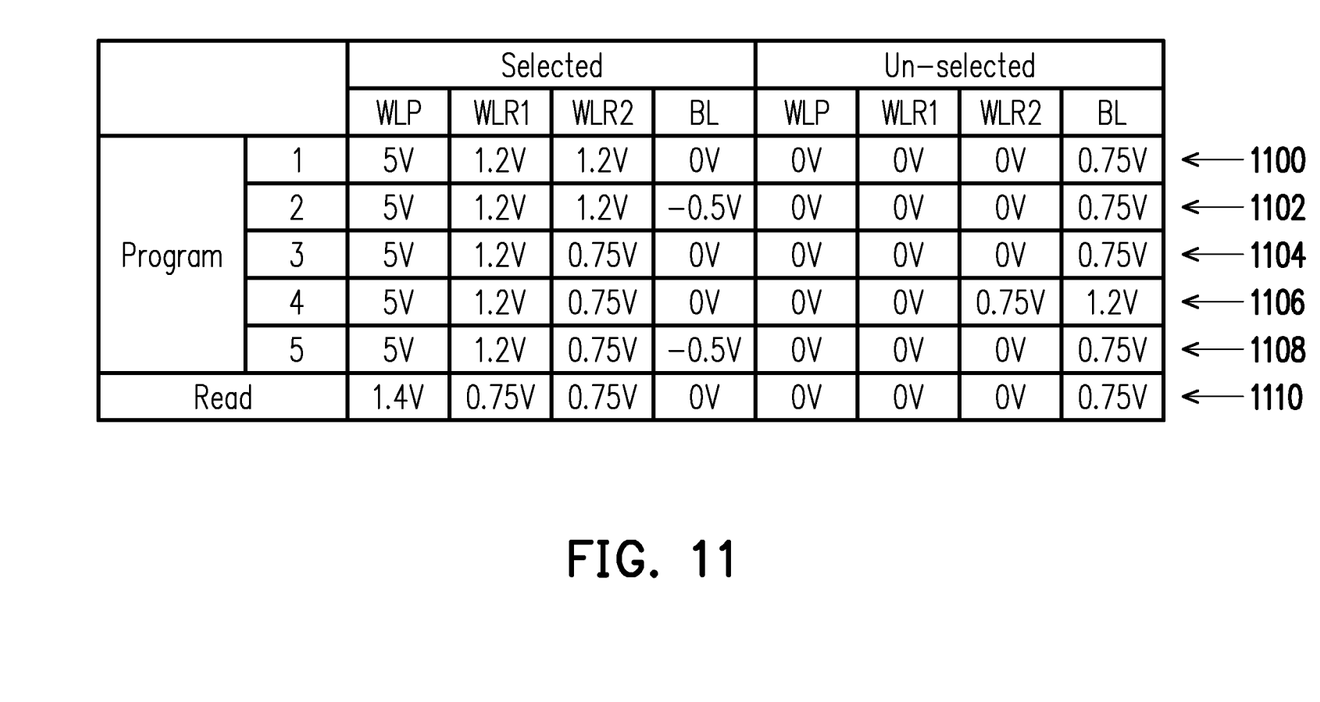
FIG. 11 illustrates example bias voltages for the OTP memory cells shown in FIG. 10.

FIG. 10 depicts a memory array with third OTP memory cells in accordance with some embodiments. Although FIG. 10 shows nine OTP memory cells, other embodiments can include any number of OTP memory cells in a memory array. Additionally, bias voltages BL1, BL2, BL3, WLP, WLR1, and WLR2 for the bit lines 1006*a*, 1006*b*, 1006*c*, and the word lines 1008*a*, 1010*a*, 1012*a*, 1008*b*, 1010*b*, 1012*b*, 1008*c*, 1010*c*, 1012*c*, respectively, are shown. Any suitable bias voltages can be used, and FIG. 11 illustrates example bias voltages for the OTP memory cells. In general, the bias voltages are determined based on the power domains associated with the OTP memory cells. Example power domains include, but are not limited to, a program voltage, an intermediate voltage, a nominal voltage, and a ground voltage. The program voltage is used for programming an OTP memory cell and is applied to the WLP signal line. Non-limiting examples of the various voltages include, but are not limited to, a program voltage in the range of two to six volts and an intermediate voltage that is between a nominal voltage and the program voltage. The nominal voltage typically is a normal or standard voltage for a transistor and is determined by the process technology, with one example of a nominal voltage being 0.75 volts. The ground voltage is similar to VSS, and in some embodiments, the ground voltage is plus/minus several hundred millivolts to control leakage or voltage stress.

In some situations, a higher program voltage can be used to reduce the amount of time that is used to program the OTP memory cells. However, too high a voltage can produce some undesirable side-effects, such as transistor stress for the selected OTP memory cell (e.g., OTP memory cell 1002) and the half-selected OTP memory cells (e.g., OTP memory cells 1004), large power, and increased difficultly in designing the memory array circuits (e.g., voltage generator, BL-MUX circuits and so on). To reduce the voltage stress, the intermediate voltage is applied to the WLR1 signal line during programming. The intermediate voltage reduces the voltage stress on the select transistor(s) (e.g., the second transistor 202 and the third transistor 700) for the selected OTP memory cell (e.g., OTP memory cell 1002) and for the half-selected OTP memory cells (e.g., OTP memory cells 1004).

In FIG. 10, the WLR signal lines for the second transistor (e.g., second transistor 202) and the third transistor (e.g., third transistor 700) are distinct signal lines (not connected together). The transistors in each OTP memory cell are connected in series (e.g., the anti-fuse transistor and the first and the second select transistors).

The memory array 1000 includes a selected OTP memory cell 1002. The remaining OTP memory cells are unselected. The selected OTP memory cell 1002 is selected by applying a program voltage to the word line program (WLP) signal line 1008*a* connected to the first transistor (e.g., anti-fuse transistor), an intermediate voltage to the WLR1 signal line 1010*a* connected to the second transistor (e.g., first select transistor), and a nominal voltage to the WLR2 signal line 1012*a* connected to the third transistor (e.g., second select transistor). A ground voltage is applied to the BL2 signal line 1006*b* that is connected to the selected OTP memory cell 1002. In a non-limiting example, the program voltage is 5 volts, the intermediate voltage is 1.2 volts, the nominal voltage is 0.75 volts, and the ground voltage is zero volts. In this example, the second and third bias voltages produce a step-up WLR.

For the unselected OTP memory cells, the ground voltage is applied to the WLP signal lines 1008*b*, 1008*c* connected to the first transistor, the WLR1 signal line 1010*b*, 1010*c* connected to the second transistor, and the WLR2 signal line 1012*b*, 1012*c* of the third transistor. The nominal voltage is also applied to the BL1 and BL3 signal lines 1006*a*, 1006*c*.

FIG. 11 illustrates example bias voltages for the OTP memory cells shown in FIG. 10. Some of the example bias voltages can relax the voltage stress on the transistors in the circled regions 1004, 1005. Five different bias voltages are depicted for a program operation. The five example bias voltages show different characteristics of the bias voltages.

The first (1) bias voltages 1100 for the selected and unselected OTP memory cells are the program, intermediate, nominal, and ground voltages described in conjunction with FIG. 10. The second (2) bias voltages 1102 apply a negative bias of −0.5 volts on the BL2 signal line 1006*b* connected to the selected OTP memory cell 1002, apply a program voltage (e.g., 5 volts) on the WLP signal line 1008*a* connected to the selected OTP memory cell 1002, and apply an intermediate voltage (e.g., 1.2 volts) on the WLR1 and WLR2 signal lines 1010*a*, 1012*a* connected to the selected OTP memory cell 1002. The negative voltage bias on the BL2 signal line 1006*b* maintains a sufficient program bias to the selected OTP memory cell 1002. For the unselected memory cells, a ground voltage (e.g., zero volts) is applied to the WLP signal line 1008*b*, the WLP signal line 1008*c*, the WLR1 signal lines 1010*b*, 1012*b*, and the WLR2 signal lines 1010*c*, 1012*c*. A nominal voltage (e.g., 0.75 volts) is applied to the BL1 and BL3 signal lines 1006*a*, 1006*c*.

The third (3) bias voltages 1104 apply a program voltage (e.g., 5 volts) to the WLP signal line 1008*a* connected to the selected OTP memory cell 1002, an intermediate voltage (e.g., 1.2 volts) to the WLR1 signal line 1010*a* connected to the second transistor in the selected OTP memory cell 1002, and a step-up WLR nominal voltage (e.g., 0.75 volts) on the WLR2 signal line 1012*a* connected to the third transistor in the selected OTP memory cell 1002. A ground voltage (e.g., zero volts) is applied to the BL2 signal line 1006*b* connected to the selected OTP memory cell 1002. The step-up WLR nominal voltage relaxes the voltage stress on the transistors in the unselected OTP memory cells. For the unselected memory cells, a ground voltage (e.g., zero volts) is applied to the WLP signal line 1008*b*, the WLP signal line 1008*c*, the WLR1 signal lines 1010*b*, 1012*b*, and the WLR2 signal lines 1010*c*, 1012*c*. A nominal voltage (e.g., 0.75 volts) is applied to the BL1 and BL3 signal lines 1006*a*, 1006*c*.

The fourth (4) bias voltages 1106 apply a higher inhibit voltage (e.g., an intermediate voltage (1.2 volts)) to the BL1 and BL3 signal lines 1006*a*, 1006*c* and a higher inhibit voltage (e.g., a nominal voltage (0.75 volts)) to the WLR2 signal lines 1012*b*, 1012*c* connected to the third transistors of the unselected OTP memory cells. A ground voltage (e.g., zero volts) is applied to the WLP signal lines 1008*b*, 1008*c* and to the WLR1 signal lines 1010*b*, 1010*c* of the unselected OTP memory cells. For the selected OTP memory cell, a program voltage (e.g., five volts) is applied to the WLP signal line 1008*a* connected to the first transistor, an intermediate voltage (e.g., 1.2 volts) is applied to the WLR1 signal line 1010*a* connected to the second transistor, a nominal voltage (e.g., 0.75 volts) is applied to the WLR2 signal line 1012*a* connected to the third transistor, and a ground voltage of (e.g., zero volts) is applied to the BL2 signal line 1006*b* connected to the selected OTP memory cell 1002.

The fifth (5) bias voltages 1108 combine the second and the third bias voltages 1102, 1104. A negative bias is applied on the BL2 signal line 1006*b* connected to the selected OTP memory cell 1002 and the step-up WLR nominal voltage (e.g., 0.75 volts) is applied to the WLR2 signal line 1012*a* connected to the third transistor in the selected OTP memory cell 1002.

In FIG. 11, example bias voltages are shown for a read operation 1110. An intermediate voltage (e.g., 1.4 volts) is applied to the WLP signal line 1008*a* of the selected OTP memory cell 1002 and a nominal voltage (e.g., 0.75 volts) is applied to the WLR1 and WLR2 signal lines 1010*a*, 1012*a* connected to the selected OTP memory cell 1002. A ground voltage (e.g., zero volts) is applied to the BL2 signal line 1006*b* connected to the selected OTP memory cell 1002. For the unselected memory cells, a ground voltage (e.g., zero volts) is applied to the WLP signal line 1008*b*, the WLP signal line 1008*c*, the WLR1 signal lines 1010*b*, 1012*b*, and the WLR2 signal lines 1010*c*, 1012*c*, and a nominal voltage (e.g., 0.75 volts) is applied to the BL1 and BL3 signal lines 1006*a*, 1006*c*.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In one aspect, a one-time-programmable (OTP) memory cell includes an anti-fuse transistor connected in series with a select transistor. The anti-fuse transistor includes a first gate, a first dopant region that forms a first source/drain region, and a second dopant region that forms a second source/drain region. The select transistor includes a second gate, the second dopant region that forms a third source/drain region, and a third dopant region that forms a fourth source/drain region. An additional fourth dopant region connects to the first dopant region and extends partially under the first gate of the anti-fuse transistor. The additional fourth dopant region forms an additional current path for a read current.

In another aspect, an OTP memory cell includes an anti-fuse transistor, a first select transistor operatively connected to the anti-fuse transistor, and a second select transistor operatively connected to the first select transistor. A first word line read signal line is connected to a first gate of the first select transistor. A second word line read signal is connected to a second gate of the second select transistor and to the first word line read signal line such that the first and the second select transistors form a cascaded select transistor.

In yet another aspect, an electronic device includes a memory array and a processing device operatively connected to the memory array. The memory array includes a one-time-programmable (OTP) memory cell includes an anti-fuse transistor connected in series with a select transistor. The anti-fuse transistor includes a first gate, a first dopant region that forms a first source/drain region, and a second dopant region that forms a second source/drain region. The select transistor includes a second gate, the second dopant region that forms a third source/drain region, and a third dopant region that forms a fourth source/drain region. An additional fourth dopant region connects to the first dopant region and extends partially under the first gate of the anti-fuse transistor. A first contact is connected to the first dopant region. A second contact is connected to the second dopant region. The processing device is operable to cause a bias voltage to be applied to the first contact to activate an additional current path created by the additional fourth dopant region for a read current and to the second contact to activate a second current path for the read current.

The description and illustration of one or more aspects provided in this application are not intended to limit or restrict the scope of the disclosure as claimed in any way. The aspects, examples, and details provided in this application are considered sufficient to convey possession and enable others to make and use the best mode of claimed disclosure. The claimed disclosure should not be construed as being limited to any aspect, example, or detail provided in this application. Regardless of whether shown and described in combination or separately, the various features (both structural and methodological) are intended to be selectively included or omitted to produce an embodiment with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

What is claimed is:

1. A one-time-programmable (OTP) memory cell, comprising:
   an anti-fuse transistor;
   a first select transistor operatively connected to the anti-fuse transistor;
   a second select transistor operatively connected to the first select transistor, and
   a bit line connected to a drain/source region of the second select transistor, wherein the bit line is configured to receive a negative bias voltage during a program operation.

2. The OTP memory cell of claim 1, wherein the first select transistor and the second select transistor are operatively connected in parallel to a word line read signal line such that the first and the second select transistors form a cascaded select transistor.

3. The OTP memory cell of claim 2, wherein the cascaded select transistor is connected in series with the anti-fuse transistor.

4. The OTP memory cell of claim 1, wherein:
   a first gate of the first select transistor is operatively connected to a first word line read signal line; and
   a second gate of the second select transistor is operatively connected to a second word line read signal line.

5. The OTP memory cell of claim 4, wherein the first word line read signal line is configured to receive a first bias voltage and the second word line read signal line is configured to receive a second bias voltage.

6. The OTP memory cell of claim 1, wherein a drain/source region of the anti-fuse transistor is connected to a floating region.

7. A memory device, comprising:
   a plurality of one-time-programmable (OTP) memory cells, each OTP memory cell comprising:
      an anti-fuse transistor;
      a first select transistor operatively connected to the anti-fuse transistor; and
      a second select transistor operatively connected to the first select transistor, wherein:
         a first word line read signal line is connected to a first gate of the first select transistor; and
         a second word line read signal line is connected to a second gate of the second select transistor;
   wherein:
      the anti-fuse transistor comprises a third gate, a first dopant region that forms a first source/drain region, and a second dopant region that forms a second source/drain region, and
      the memory device further comprises a first contact contacting the second dopant region the first contact configured to receive a bias voltage to activate an additional current path.

8. The memory device of claim 7, wherein the second word line read signal line is connected to the first word line read signal line such that the first and the second select transistors form a cascaded select transistor.

9. The memory device of claim 7, wherein the first word line read signal line is configured to receive a first bias voltage and the second word line read signal line is configured to receive a second bias voltage.

10. The memory device of claim 7, wherein the memory device further comprises:
    a third dopant region extending from the first dopant region to under a portion of the third gate; and
    a second contact contacting the first dopant region, the second contact configured to receive a bias voltage to activate an additional current path.

11. The memory device of claim 10, further comprising a conductive element connecting the first contact to a second contact.

12. An electronic device, comprising:
    a processing device;
    a memory array operatively connected to the processing device, the memory array comprising:
       a one-time-programmable (OTP) memory cell, comprising:
          an anti-fuse transistor;
          a first select transistor operatively connected in series to the anti-fuse transistor;
          a second select transistor operatively connected to the first select transistor;
          a first word line read signal line connected to a first gate of the first select transistor; and
          a second word line read signal line connected to a second gate of the second select transistor and to the first word line read signal line such that the first and the second select transistors form a cascaded select transistor.

13. The electronic device of claim 12, wherein:
    the anti-fuse transistor comprises the first gate, a first dopant region that forms a first source/drain region, and a second dopant region that forms a second source/drain region;
    the first select transistor comprises the second gate, the second dopant region that forms a third source/drain region, and a third dopant region that forms a fourth source/drain region; and
    the OTP memory cell further comprises a fourth dopant region that connects to the first dopant region and extends partially under the first gate of the anti-fuse transistor, the additional fourth dopant region creating an additional current path for a read current.

14. The electronic device of claim 13, wherein the OTP memory cell further comprises a halo region formed between the first dopant region and the fourth dopant region and adjacent the first dopant region.

15. The electronic device of claim 13, wherein the OTP memory cell further comprises a halo region formed between the second dopant region and the third dopant region and adjacent the second dopant region.

16. The electronic device of claim 13, wherein the first dopant region, the second dopant region, the third dopant region, and the fourth dopant region are formed with a dopant or dopants having a first conductivity type.

17. The OTP memory cell of claim 1, wherein the first word line read signal line is electrically connected to the second word line read signal line.

18. The OTP memory cell of claim 1, wherein the anti-fuse transistor comprises a first dopant region that forms a first source/drain region, and a second dopant region that forms a second source/drain region, and a first contact contacting the second dopant region, the first contact configured to receive a bias voltage to activate an additional current path.

19. The memory device of claim 7, wherein the second select transistor is connected to a bit line.

20. The memory device of claim 7, wherein the second select transistor includes a first source/drain region connected to a bit line, and a second source/drain region connected to a first source/drain region of the first select transistor.

\* \* \* \* \*